United States Patent
Chen

(10) Patent No.: US 7,098,091 B2
(45) Date of Patent: Aug. 29, 2006

(54) METHOD FOR FABRICATING THIN FILM TRANSISTORS

(75) Inventor: KunHong Chen, Taipei (TW)

(73) Assignee: Au Optronics Corporation, Hsin-Chu (TW)

( * ) Notice: Subject to any disclaimer, the term of this patent is extended or adjusted under 35 U.S.C. 154(b) by 47 days.

(21) Appl. No.: 10/783,553

(22) Filed: Feb. 20, 2004

(65) Prior Publication Data

US 2005/0186719 A1    Aug. 25, 2005

(51) Int. Cl.
*H01L 21/84* (2006.01)

(52) U.S. Cl. ....................... 438/158; 438/161

(58) Field of Classification Search ............... 438/158, 438/161
See application file for complete search history.

(56) References Cited

U.S. PATENT DOCUMENTS

| | | | | |
|---|---|---|---|---|
| 4,778,560 A * | 10/1988 | Takeda et al. | ............... | 438/158 |
| 5,998,230 A * | 12/1999 | Gee-Sung et al. | ............ | 438/30 |
| 6,156,583 A * | 12/2000 | Hwang | ......................... | 438/30 |
| 6,317,173 B1 | 11/2001 | Jung et al. | | |
| 6,338,989 B1 * | 1/2002 | Ahn et al. | ................... | 438/158 |
| 6,376,288 B1 * | 4/2002 | Jen et al. | ..................... | 438/158 |
| 6,387,740 B1 * | 5/2002 | Jen et al. | ..................... | 438/160 |
| 6,500,703 B1 * | 12/2002 | Takemura | ................... | 438/158 |
| 6,555,409 B1 * | 4/2003 | Kim et al. | .................... | 438/34 |
| 6,586,286 B1 * | 7/2003 | Park et al. | ................... | 438/155 |
| 6,653,160 B1 * | 11/2003 | Moon et al. | .................. | 438/30 |
| 6,680,223 B1 * | 1/2004 | Yamazaki et al. | .......... | 438/149 |
| 6,682,961 B1 * | 1/2004 | Kim | .......................... | 438/149 |
| 6,882,376 B1 * | 4/2005 | Kim et al. | .................... | 349/43 |
| 6,905,917 B1 * | 6/2005 | Song et al. | ................. | 438/149 |
| 6,908,780 B1 * | 6/2005 | Lai | ............................. | 438/30 |
| 6,969,643 B1 * | 11/2005 | Kim | .......................... | 438/149 |
| 2002/0045299 A1 * | 4/2002 | Young | ........................ | 438/160 |
| 2002/0160555 A1 * | 10/2002 | Hong et al. | ................. | 438/158 |
| 2004/0031991 A1 * | 2/2004 | Jang | ........................... | 257/347 |
| 2004/0089900 A1 * | 5/2004 | Ishikawa et al. | ............ | 257/347 |

FOREIGN PATENT DOCUMENTS

TW    465117    11/2001

* cited by examiner

*Primary Examiner*—David E. Graybill
(74) *Attorney, Agent, or Firm*—Duane Morris LLP

(57) ABSTRACT

A method is disclosed for forming a thin film field effect transistor. On a preliminary substrate having at least a glass substrate layer and a buffer layer, source and drain metal regions of the transistor are formed for defining an opening, in which a silicon layer, gate oxide layer, and gate metal layer are formed thereafter. A first photoresist pattern having a two-portion structure is used for selectively removing portions of the gate metal, gate oxide, and silicon layers. After forming a second photoresist pattern with a coverage area smaller than that of the first photoresist pattern, it is used for reducing the gate metal layer. By doping a predetermined impurity in the silicon layer, a source region and drain region of a predetermined type is completed.

20 Claims, 5 Drawing Sheets

302 Create the TFTs' source and drain metal electrodes and device metal circuit patterns upon the glass substrate and buffer layers.

304 A single mask pattern/exposure process for creating the TFTs' gate stack.

306 A single pattern and etch sequence for creating vertical openings for interlevel connections of the TFTs' source and drain regions.

308 A single pattern and etch sequence for creating the top level metal circuit patterns.

300

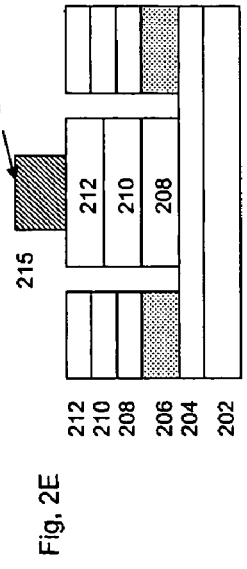
Fig. 2A
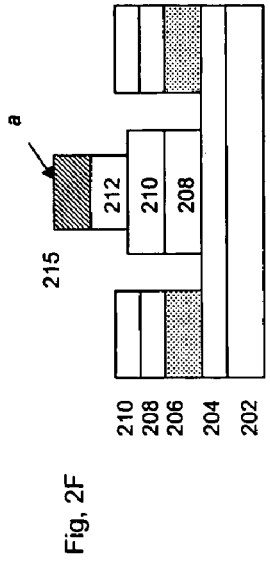
Fig. 2B
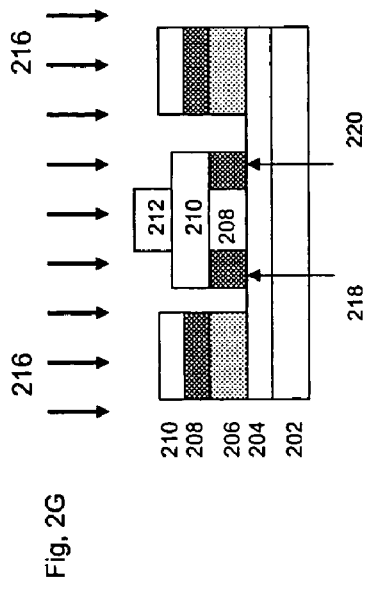
Fig. 2C
Fig. 2D
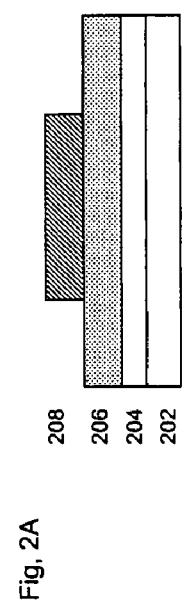
Fig. 2E
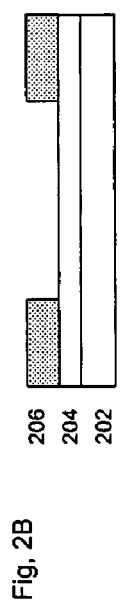
Fig. 2F
Fig. 2G

METHOD FOR FABRICATING THIN FILM TRANSISTORS

BACKGROUND

The present disclosure relates generally to semiconductor device manufacturing, and more particularly to the fabrication methods of thin film transistors used in electro-optical display devices, and the like.

The manufacture of semiconductor integrated circuits (ICs) and devices require the use of many photolithography process steps to define and create specific circuit components and circuit layouts onto an underlying substrate. Conventional photolithography systems project specific circuit and/or component images, defined by a mask pattern reticle, onto a flat substrate coated with a light sensitive film (photoresist) coating. After image exposure, the film is then developed leaving the printed image of the circuit and/or component on the substrate. The imaged substrate is subsequently processed with techniques such as etching and doping to alter the substrate with the transferred pattern. Photolithography processes are used multiple times during the fabrication of thin film field effect transistors (TFTs) that are used in electro-optical display devices and sensors.

Each photolithography process sequence represents invested fabrication costs to the final cost of the completed device. Such fabrication costs include all costs related to materials, labor, facilities, production yield losses and the time spent in the production state. Any process flow simplification that provides a reduction in any of the above mentioned cost areas will provide a net improvement to the final cost of fabricating the device. It is highly desirable to create and implement new process flows that feature process simplifications to lower fabrication costs. The reduction of photolithography process sequences represents a form of process simplification. Such process simplification will provide significant cost improvement for a given production facility to maintain highly competitive cost and output advantages over other manufacturers of similar product devices.

What is desirable is an improved process flow that features process simplifications to lower fabrication costs while maintaining the required physical and electrical performance characteristics of the semiconductor device and components.

SUMMARY

A method is disclosed for forming a thin film field effect transistor. On a preliminary substrate having at least a glass substrate layer and a buffer layer, source and drain metal regions of the transistor are formed for defining an opening, in which a silicon layer, gate oxide layer, and gate metal layer are formed thereafter. A first photoresist pattern having a two-portion structure is used for selectively removing portions of the gate metal, gate oxide, and silicon layers. After forming a second photoresist pattern with a coverage area smaller than that of the first photoresist pattern, it is used for reducing the gate metal layer. By doping a predetermined impurity in the silicon layer, a source region and drain region of a predetermined type is completed.

These and other aspects and advantages will become apparent from the following detailed description, taken in conjunction with the accompanying drawings, illustrating by way of example the principles of the disclosure.

BRIEF DESCRIPTION OF THE DRAWINGS

FIGS. 2A to 2I illustrate cross-sectional views of a thin film transistor going through a fabrication process utilizing four photolithography masks according to one example of the present disclosure.

DESCRIPTION

The present disclosure describes a method for the effective fabrication of thin film field effect transistors (TFTs) using four photolithography masks as opposed to six photolithography masks as used in conventional production flows. The electrically active transistor areas of the final completed TFT devices fabricated in accordance with the present disclosure feature regions and components that are of similar composition and structure as those fabricated by the conventional six mask production flow. For simplifying the illustration, a production process for making a p-channel thin film transistor is used, but it is understood that the process is applicable to n-channel devices as well with appropriate and obvious modifications such as using different doping materials and material compositions.

Figure 1E:
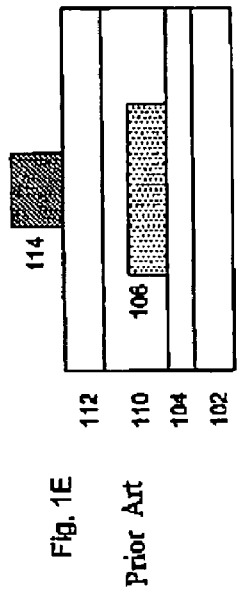
FIGS. 1A to 1J illustrate cross-sectional views of a p-channel thin film transistor (P-TFT) going through a conventional production process utilizing six photolithography masks.
Figure 1F:
Figure 1A:
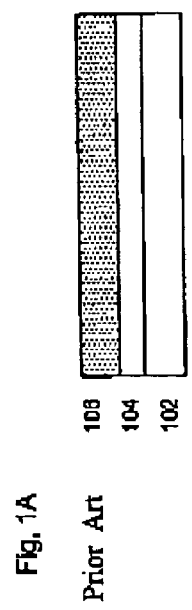

Referring now to FIGS. 1A through 1J, there are cross-sectional views of the production process sequences of a conventional p-channel thin film transistor (P-TFT) utilizing six photolithography masks. FIG. 1A shows a flat glass substrate 102 initially processed to obtain two additional films stacked upon the substrate surface. A buffer layer 104, usually comprised of an insulating material such as silicon oxide, is either deposited using chemical vapor deposition, or thermally grown in a gaseous environment. A poly-silicon layer 106 is then deposited upon the glass-buffer layer stack. The poly-silicon layer 106 is usually deposited using chemical vapor deposition and may be lightly doped during the deposition process with either n-type or p-type dopants. The optional doping of the poly-silicon layer 106 allows for the adjustment of the TFTs' voltage threshold characteristics along the transistor electrical gate channel that is defined during subsequent steps. It is noted that some conventional flows may use amorphous silicon as the material layer instead of the poly-crystalline silicon layer 106 used in this example.

Figure 1B:
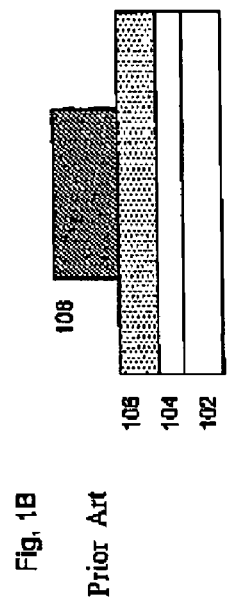
Figure 1C:
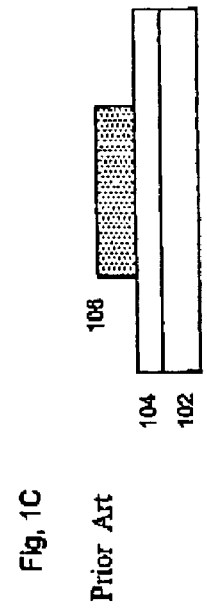
Figure 1D:
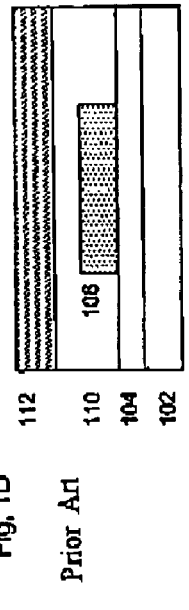

The first photolithographic mask pattern 108 is placed on top of the poly-silicon 106, buffer 104, glass substrate 102 stack as shown in FIG. 1B. The mask pattern 108 is used to pattern the poly-silicon regions 106 where transistors will be located on the buffer layer 104 and substrate 102. The poly-silicon regions 106 under the mask pattern 108 are blocked from the poly-silicon etching process, thus forming segregated poly-silicon areas 106 as shown in FIG. 1C, that will subsequently become the base for an individual TFT device or simply TFT. A dielectric layer 110 such as silicon oxide is then either thermally grown in a gaseous environment or deposited by chemical vapor deposition on top of the exposed poly-silicon 106 and buffer 104 areas, as shown in FIG. 1D. This dielectric layer 110 is also known as the gate oxide layer, later serving as the gate dielectric of the TFT. FIG. 1D also shows the next layer, the gate metal layer 112, deposited on top of the gate oxide layer 110. The gate metal layer 112 is usually deposited upon the gate oxide 110 surface by ion sputtering of a metal source or by a chemical electrolysis process.

FIG. 1E shows the second photolithography mask pattern 114 situated on top of the gate metal layer 112. This mask pattern 114 allows for the etching-off of selected gate metal areas to create the TFT gate electrodes, as well as gate metal lines horizontal to the substrate 102 plane to connect selected multiple TFT gates forming specific circuit paths. The gate metal etch is usually performed using wet chemistries and may be supplemented with a dry chemical plasma etch.

FIG. 1F illustrates the view of the gate electrode 112 after the etching of the gate metal layer and after the removal of the mask pattern 114. After the removal of the mask pattern 114, the poly-silicon regions 118 and 120 adjacent to but not directly under the gate electrode 112 are doped with a p-type dopant. This doping process, usually accomplished by ion implantation 116 of p-type dopants such as boron or boron-difluoride, creates the TFTs' P+ source 118 and drain 120 regions within the poly-silicon area 106. It is noted that the poly-silicon region 106 located directly under the gate region, not doped by the doping process becomes the TFTs' electrical gate channel. The active TFT components, source 118, drain 120, gate 112 and transistor channel regions are now complete. It is also noted that the ion implantation process 116 is calibrated such that dopant placement is primarily located within the poly-silicon regions 118 and 120 and the gate metal 112 blocks the doping of the transistor gate channel. For the fabrication of n-channel TFT structures, the source/drain ion implantation 116 will utilize n-type dopants such as phosphorus to create N+ source and drain regions. A thermal anneal process (not shown in the attached figures) is usually performed after the source, drain doping process to repair any physical damage to the doped layers, as well as to activate and distribute the added dopants.

Figure 1G:
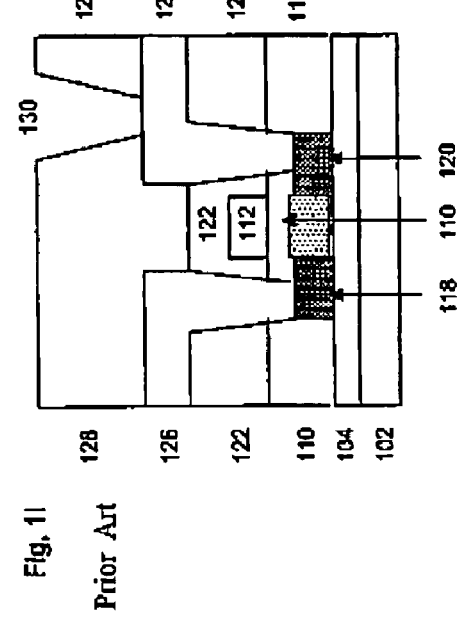

FIG. 1G illustrates the cross-sectional view of the TFT device after processing through the third mask. The figure shows an interlevel dielectric (ILD) layer 122 that has been deposited on top of the gate metal 112. The ILD layer 122 has been patterned and etched to create selected areas of vertical openings 124 from the top surface of the ILD layer 122 down to expose the TFT source 118 and drain 120 regions. The ILD layer 122 is usually created by a chemical deposition process and etched using a wet chemical and/or dry chemical plasma process. The vertical openings 124 are then lined and filled with conductive metal(s), usually by ion sputtering, to provide a vertical interconnection path from the top of the ILD layer 122 to the TFTs' source 118 and drain 120 regions.

After the creation of the filled vertical interconnections, a new blanket metal layer 126 is then deposited upon the ILD layer 122. This metal layer 126 is usually created by ion sputtering of a metal source or by a chemical electrolysis process. The fourth mask pattern (not shown) is then placed on top of the metal layer 126, used to define and create the horizontal metal lines connecting selected source 118 and drain 120 regions of selected TFTs to form a desired circuit. FIG. 1H shows the cross-sectional view of the TFT device after the fourth mask pattern has been applied and the metal pattern etched. The new metal lines 126 on top of the ILD layer 122 are shown connected to the TFT source 118 and drain 120 regions through the previously created and filled vertical interconnects 124. After the formation of the metal lines 126, a passivation dielectric layer 128 is then deposited on top of the TFT device.

Figure 1I:
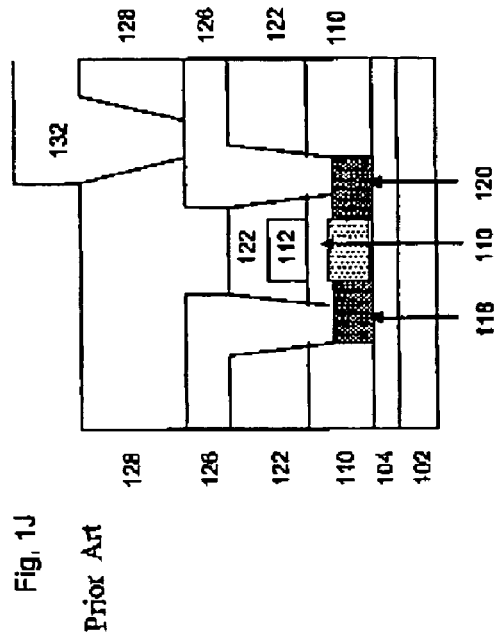
Figure 1H:
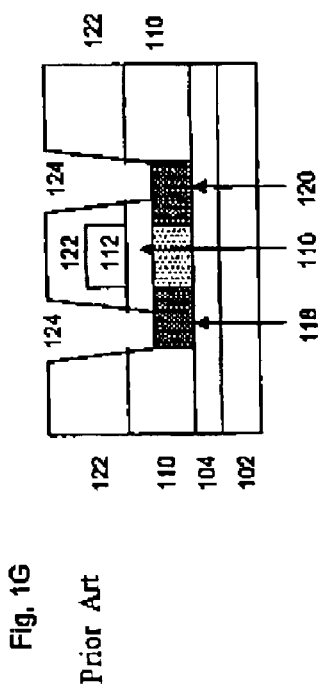

FIG. 1I shows the cross-sectional view of the TFT device after using the fifth mask pattern. The fifth mask pattern has been placed on top of the passivation layer 128 and used to selectively etch off certain regions of the layer to expose a vertical interconnect path opening 130 to the last-placed metal lines 126. The etched openings 130 are vertical interconnection paths to connect the last-placed (source and drain) metal lines 126 to the next metal lines that will be created on the top surface of the passivation layer 128. The passivation dielectric layer 128 is usually created by a chemical deposition process and etched using a wet chemical and/or dry chemical plasma process. The vertical openings 130 are lined and filled with conductive metal(s), usually by ion sputtering.

Figure 1J:
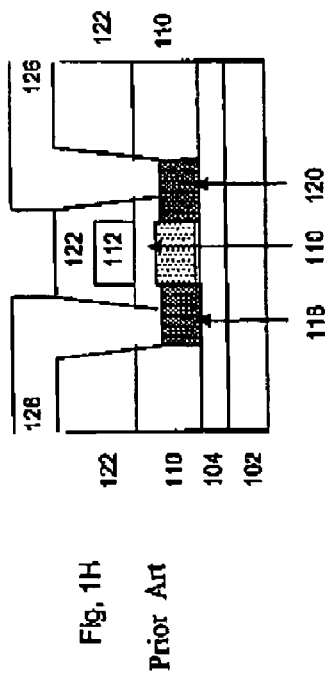

After the vertical interconnection openings 130 are lined and filled with conductive metal(s), a final routing metal layer 132 is deposited upon the surface of the passivation layer 128. This final conducting layer 132, usually comprised of indium tin oxide (ITO), is then patterned using the sixth and final mask pattern to create the circuit paths for final routing of the TFTs' source 118 and drain 120 regions. FIG. 1J illustrates this showing the filled vertical interconnection openings 130 and the etched ITO metal lines 132. After the completion of this sixth mask processing, the basic TFT device is completed. The basic TFT device features the following basic components, a gate stack comprised of gate electrode metal, gate oxide and an undoped polysilicon region, doped polysilicon regions as the source and drain structures, a first level metal layer for source and drain metal connections and circuit routings, and a second level metal comprised of ITO for additional source and drain connections and circuit routings.

Figure 2H:
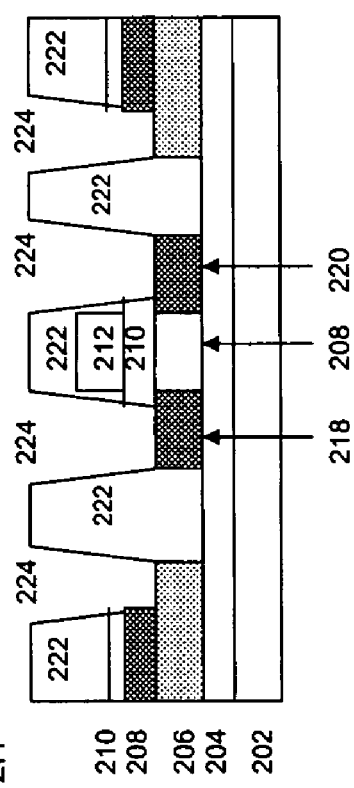

FIGS. 2A through 2I are cross-sectional views of a p-channel thin film transistor (P-TFT) in production process sequences utilizing four photolithography masks (or mask patterns) in accordance with one example of the present disclosure. FIG. 2A shows a flat glass substrate 202 initially processed to obtain two additional films and the first mask pattern applied upon the stacked substrate surface. Firstly, a buffer layer 204, usually comprised of an insulating material such as silicon oxide, is either deposited using chemical vapor deposition, or thermally grown in a gaseous environment. A metal layer 206 is then deposited upon the glass-buffer stack layer. The metal layer 206 is usually deposited by ion sputtering of a metal source or by a chemical electrolysis process. As shown in FIG. 2A, the first photoresist mask pattern 208 is used to selectively etch and remove areas of the metal layer such that the remaining metal pattern areas define the locations of the TFTs' source and drain metal electrodes as well as the device metal circuit routing of the same. FIG. 2B illustrates the cross-sectional view of the source/drain metal pattern 206 after the completion of the metal pattern and etch process steps.

The metal patterned, glass-buffer substrate stack 202–206 is then processed through three film additions before the next mask pattern/etch sequence is applied. FIG. 2C shows a poly-silicon layer deposited upon the metal patterned, glass-buffer substrate stack. This poly-silicon (or amorphous silicon) layer 208 is usually deposited using chemical vapor deposition and may be lightly doped during the deposition process with either n-type or p-type dopants. A dielectric layer 210 such as silicon oxide is then either thermally grown in a gaseous environment or deposited by chemical vapor deposition on top of the poly-silicon 208 layer. This dielectric layer 210 is also known as the gate oxide layer, later serving as the gate dielectric of the TFT device. The next layer, the gate metal layer 212, is deposited on top of the gate oxide layer 210. The gate metal layer 212 is usually deposited upon the gate oxide layer 210 by ion sputtering of a metal source or by a chemical electrolysis process. The second mask photoresist layer 214 is then coated onto selected areas of the gate metal layer 212.

As shown in FIG. 2C, this second mask pattern may be applied onto selected areas of the gate metal layer 212 as conventional single portion (single height, single width) regions 214. Other selected areas of the gate metal layer 212 may be patterned with portions of the mask of a half-tone mask type having at least two regions on the mask that pass the light at different rates. Because of the light dosage difference, different portions of the photoresist layer are activated to different degrees so that a distinct step-high structure or two-portion structure 214' is formed for each transistor. The two-portion photoresist structure 214' as shown in FIG. 2C features a first portion a having a predetermined geometry (e.g., height and width). The second portion b of the photoresist structure underneath a features a different geometry (e.g., width and height) surrounds the first portion a to create a two-portion single photoresist structure. It is understood that although a and b are referred to as two portions, it is really one photoresist pattern with exactly the same material. The two-portion structure may also be referred to as a step structure as well as one "steps up" from the other. The half-tone masks used can have different designs. It is further understood that for the following illustration, the widths of the first and second portions of the first photoresist pattern are shown as a point of reference to describe the changes of the layered material for making the TFT, but it is understood that the entire geometry of these layered materials change accordingly. Further, in one example, the half-tone mask has their center region made of a different material than its surrounding region to provide the capabilities for obtaining varied light shielding, thereby imposing varied light exposure dosage in a single exposure process upon the photoresist film. In another example, the two regions of the half-tone masks are made from the same material, but the center region may have a predetermined pattern for blocking or hindering the light from passing through at the same rate as the surrounding region.

After placement of the second photoresist pattern 214, 214' upon the layered substrate stack 202–212, the non-patterned, exposed areas of the stack as defined by the areas not covered by any photoresist (e.g., both single and two portion structures 214 and 214') are then subjected to etch processes to remove the top three layers: the gate metal 212, gate oxide 210 and poly-silicon 208 layers. FIG. 2D illustrates the view of the device after the etch processes. Typical etch processes used for this stack etch may include wet and dry plasma etch process methods.

The single portion 214 and two-portion 214' photoresist pattern structures are then selectively reduced to form a second photoresist pattern 215 such that the two-portion structure becomes a single portion structure. The second photoresist pattern has a smaller coverage area (i.e., the area that it covers other materials underneath) than that of the first photoresist pattern 214'. It is noted that the single portion patterns 214 on top of the source and drain metal layers have now been removed along with the removal of portions of the two-portion photoresist structure. This photoresist pattern removal/reduction can be done by a dry plasma and/or a wet chemical etch process. The residual, new photoresist structure 215 may have its photoresist coverage area as much as or smaller than that of the first portion a of the original two-portion structure 214'. FIG. 2E shows the view of the TFT device with the reduced photoresist pattern 215 located on top of the etched stack layer 208–212. The device with the reduced photoresist pattern 215 is then subjected to another etch process for etching only the exposed gate metal layer 212. This etch may be accomplished by using wet chemistry and may be supplemented with a dry chemical plasma etch. The resulting TFT device is shown in FIG. 2F as all previously exposed gate metal layer not covered by the reduced photoresist pattern 215 having been removed. The use of the second mask is now complete and the remaining photoresist 215 is now removed.

At the completion of this process step, two key transistor definition steps are accomplished. The use of the first photoresist patterns 214 and 214' to etch the gate metal 212, gate oxide 210 and the poly-silicon 208 layers segregates the poly-silicon 208 layer into individual regions (gate stack) for the locations of individual TFTs. The use of the second photoresist pattern 215 to etch the gate metal layer 212 creates the gate electrodes of each TFT. It is noted that by utilizing the single, two-portion photoresist structure 214' significant cost savings can be realized by the provided process simplification comparing to the conventional TFT process flow requiring two separate mask pattern levels to accomplish the two transistor definition steps.

FIG. 2G illustrates the cross-sectional view of the gate electrode 212 after the removal of the photoresist pattern 215. After removal of the photoresist pattern 215, the poly-silicon regions 218 and 220 adjacent to, but not directly under the gate electrode 212, are doped with a p-type dopant. This doping process, usually accomplished by ion implantation 216 of p-type dopants such as boron or boron-difluoride, creates the TFTs' P+ source 218 and drains 220 regions within the poly-silicon 208 area. It is noted the poly-silicon region 208 located directly under the gate region, not doped by the doping process becomes the TFTs' electrical gate channel. The active TFT components, source 218, drain 220, gate electrode 212 and transistor channel 208 regions are now completed. It is also noted that the ion implantation process 216 is calibrated such that dopant placement is primarily located within the poly-silicon regions 218 and 220 and that the gate metal 212 blocks the doping of the transistor gate channel 208. For the fabrication of n-channel TFT structures, the source/drain ion implantation 216 will utilize n-type dopants such as phosphorus to create N+ source and drain regions 218, 220. A thermal anneal process (not shown in the attached figures) is usually performed after the source, drain doping process to repair any physical damage to the doped layers, as well as to activate and distribute the added dopants.

FIG. 2H illustrates the cross-sectional view of the TFT device after processing through the third mask pattern. FIG. 2H shows an ILD, or interlevel dielectric (or dielectric passivation) layer 222 deposited on top of the gate metal 212 and the gate oxide layer 210 after the creation of the doped TFT source 218 and drain 220 regions. The ILD layer 222 has been patterned and etched to create selected areas of vertical openings 224 from the top surface of the ILD layer 222 to expose the TFT source 218 and drain 220 regions and portions of the source and drain metal electrode regions 206. The ILD layer 222 is usually created by a chemical deposition process and etched using a wet chemical and/or dry chemical plasma process.

Figure 2I:
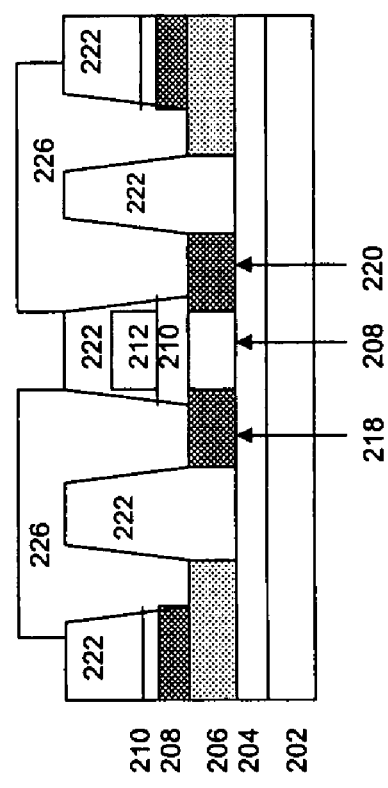

Referring now to FIG. 2I, the vertical openings 224 of FIG. 2H are then lined and filled with conductive metal(s), usually by ion sputtering, to provide vertical interconnection paths from the top of the ILD layer 222, to the TFTs' source 218 and drain 220 regions and to the source and drain metal electrode regions 206. After the creation of the filled vertical interconnections, a new blanket metal layer 226 is then deposited upon the ILD layer 222 and the filled vertical openings 224. This final metal layer 226 is typically comprised of indium tin oxide (ITO), usually created by ion sputtering of a metal source or by a chemical electrolysis process. It is this ITO metal layer 226 and the filled vertical interconnections by which the source and drain metal lines and areas 206 are connected to the TFT source 218 and drain 220 regions.

The last (fourth) mask process is then used to define and create the horizontal metal lines for final connection of the TFTs and definition of the desired device circuits. FIG. 2I shows the view of the TFT device after the fourth mask has been applied and the ITO layer patterned and etched. The ITO metal lines 226 defined on top of the ILD layer 222 are shown connected to the TFT source 218 and drain 220 regions through the previously created and filled vertical interconnects 224.

At this point, the basic TFT device is completed by using only four masks in the manufacturing process. The basic TFT device, just as produced by the conventional 6 mask fabrication processes, features the same basic components, a gate stack comprised of gate electrode metal, gate oxide and an undoped polysilicon region, doped polysilicon regions as the source and drain structures, a first level metal layer for source and drain metal connections and circuit routings, and a second level metal comprised of ITO for additional source and drain connections and circuit routings.

Figure 3:
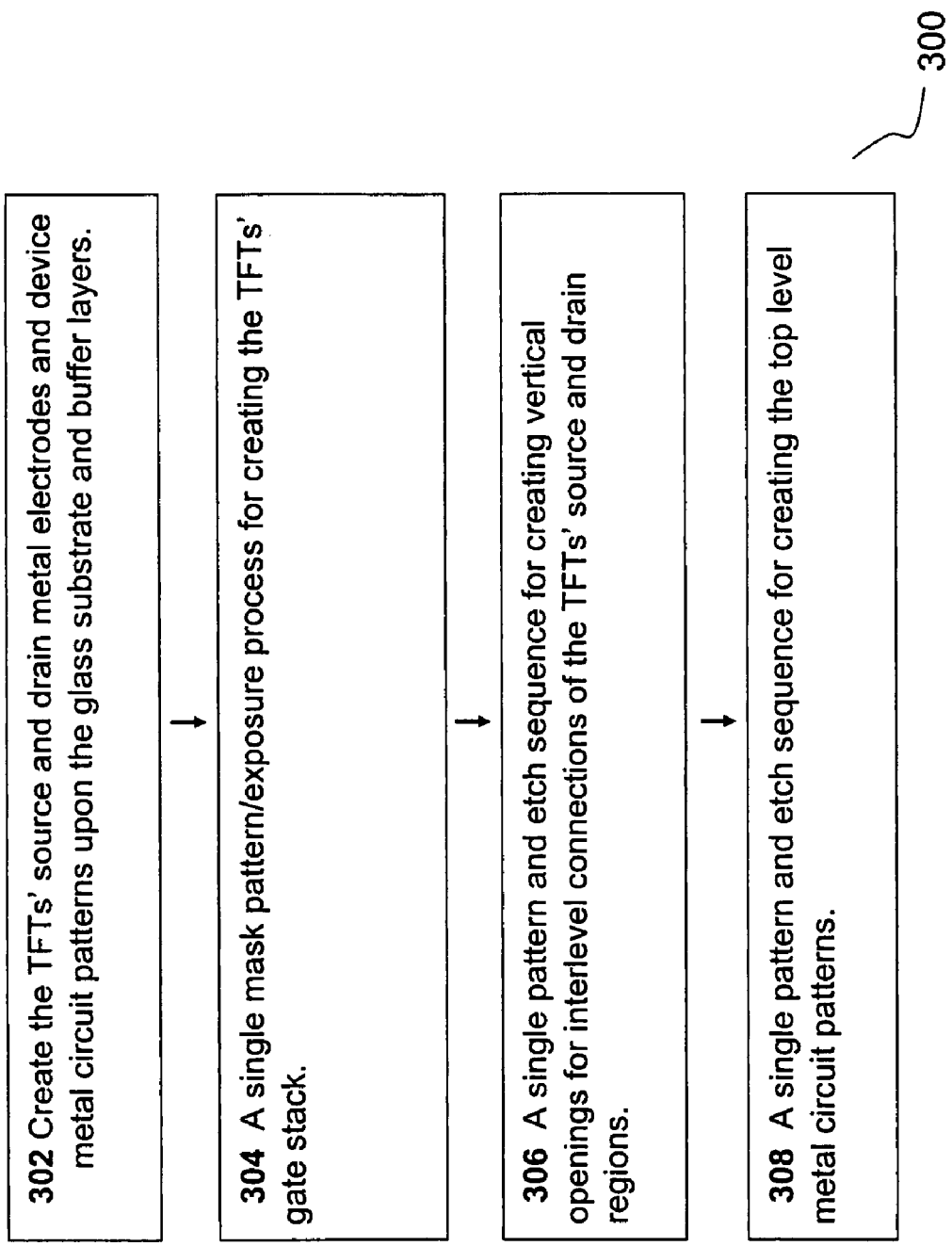
FIG. 3 is a flow diagram summarizing the production process illustrated in FIGS. 2A to 2I.

FIG. 3 is a flow diagram 300 summarizing the purpose and sequence of each photolithography mask process for the above detailed thin film transistor (TFT) fabricated in accordance with the present disclosure. In step 302, the first mask is used to create the TFTs' source and drain metal electrodes, as well as the first level of device metal circuit routes upon the glass substrate and buffer layers. The second mask pattern step 304 allows for multiple etch processes to be performed using a single photoresist pattern process. The process patterns and etches the poly-silicon, gate oxide and the gate metal layers to create the individual locations for each TFT using a two-portion structure of a photoresist pattern in a single exposure process. The use of only one mask to formulate the gate metal layer and the poly-silicon, gate oxide layers with different widths reduces manufacturing cost for making such a TFT device. In step 306, the process patterns and etches a dielectric layer to create vertical openings for interlevel connections between the TFTs' source and drain regions, the source and drain metal electrodes and the next metal layer. Metal connections are then made between the source and drain regions and the source and drain electrode lines as well as an overlaying metal circuit layer placed on top. In step 308, the process patterns the final overlaying metal layer, usually comprised of ITO material, to create final specific circuit routes with connections to the TFT's source and drain regions.

The completed TFT device as fabricated in accordance with the present disclosure is accomplished with the use of only four photolithographic masks. The TFT devices' physical dimensions, material compositions, and component locations are similar as those produced by the conventional fabrication flows utilizing six photoresist masks, to provide similar device electrical behavior and performance. The present disclosure allows for the process simplification of the TFT fabrication, by the creation of the source and drain metal layers first and then by allowing a single mask to be used to accomplish the tasks of several conventional masks. The reduction of photolithography processes provided by the present disclosure results with process simplifications that will translate into significant cost improvements for a given production facility to maintain highly competitive cost and output advantages over other manufacturers of similar product devices.

The method disclosed is suitable and compatible for implementation within existing, conventional and future fabrication process technologies. The above disclosure provides several examples for implementing the different features of the disclosure. Specific examples of components and processes are described to help clarify the disclosure. These are, of course, merely examples and are not intended to limit the scope of the disclosure from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for forming a thin film field effect transistor comprising:
    forming a preliminary substrate having at least a glass substrate layer and a buffer layer;
    forming source and drain metal regions of the transistor in predetermined locations on the buffer layer, the source and drain metal regions defining an opening;
    forming a silicon layer, a gate oxide layer, and gate metal layer within the opening;
    forming a first photoresist pattern on the gate metal layer having a two-portion structure with a first portion and a second portion underneath the first portion;
    selectively removing portions of the gate metal, gate oxide, and silicon layers using the first photoresist pattern;
    selectively reducing the first photoresist pattern to form a second photoresist pattern with a coverage area smaller than that of the first photoresist pattern;
    reducing the gate metal layer using the second photoresist pattern;
    removing the second photoresist pattern; and
    doping a predetermined impurity in the silicon layer for forming a source region and a drain region of a predetermined type.

2. The method of claim 1 further comprising forming an interlayer dielectric layer covering the transistor with the source and drain metal regions, and the source and drain regions exposed.

3. The method of claim 2 further comprising forming a conducting layer making connection with the exposed source and drain regions and the source and drain metal regions.

4. The method of claim 3 further comprising selectively removing portions of the conducting layer for additional circuit routing.

5. The method of claim 1 wherein the forming the first photoresist layer further includes selectively exposing a photoresist material to a light source by using a predetermined mask with a first and second regions, the first region passing less light than the second region for forming the two-portion structure.

6. The method of claim 5 wherein the first and second regions of the mask are made of different materials.

7. The method of claim 1 wherein the conducting layer is indium tin oxide.

8. A method for forming a thin film field effect transistor comprising:

using a first mask process for forming source and drain metal regions of the transistor in predetermined locations on a buffer layer situated on top of a glass substrate layer and for forming a silicon layer, a gate oxide layer, and gate metal layer within an opening defined by the source and drain metal regions;

using a second mask process for forming a first photoresist pattern having a two-portion structure on top of the gate metal layer for selectively removing portions of the gate metal, gate oxide, and silicon layers;

selectively reducing the first photoresist pattern to form a second photoresist pattern with a coverage area smaller than that of the first photoresist pattern for reducing the gate metal layer;

using a third mask process for forming an interlayer dielectric layer covering the transistor with the source and drain metal regions, and the source and drain regions exposed;

forming a conducting layer making connection with the exposed source and drain regions and the source and drain metal regions; and using a fourth mask process for selectively removing predetermined portions of the conducting layer for additional circuit routing.

9. The method of claim 8 further comprising removing the second photoresist pattern and doping a predetermined impurity in the silicon layer for forming a source region and a drain region of a predetermined type before the third mask process.

10. The method of claim 8 wherein the using the second mask process further includes using a predetermined mask in a single exposure process to form the first photoresist pattern with a first portion and a second portion underneath the first portion.

11. The method of claim 10 wherein the predetermined mask has a center and surrounding regions, the center region passing less light than the surrounding region for forming the two-portion structure.

12. The method of claim 11 wherein the center and surrounding regions of the mask are made of different materials with the material for the center region shielding more light than the material for the surrounding region.

13. The method of claim 11 wherein the first and second regions of the mask are made from a same material with a predetermined mask pattern on the surrounding region for hindering the light from passing therethrough.

14. A method for forming a thin film field effect transistor comprising:

forming a preliminary substrate having at least a glass substrate layer and a buffer layer;

forming source and drain metal regions of the transistor in predetermined locations on the buffer layer, the source and drain metal regions defining an opening;

forming a poly-silicon layer, a gate oxide layer, and gate metal layer sequentially within the opening;

forming a first photoresist pattern on the gate metal layer having a two-portion structure with a first portion and a second portion underneath the first portion and bigger than the first portion;

selectively removing portions of the gate metal, gate oxide, and silicon layers using the first photoresist pattern;

selectively reducing the first photoresist pattern to form a second photoresist pattern with a same coverage area as that of the first photoresist pattern;

reducing the gate metal layer using the second photoresist pattern;

removing the second photoresist pattern; and doping a predetermined impurity in the poly-silicon layer for forming a source region and a drain region of a predetermined type.

15. The method of claim 14 further comprising forming an interlayer dielectric layer covering the transistor with the source and drain metal regions, and the source and drain regions exposed.

16. The method of claim 15 further comprising forming a conducting layer making connection with the exposed source and drain regions and the source and drain metal regions.

17. The method of claim 16 wherein the conducting layer is indium tin oxide.

18. The method of claim 16 further comprising selectively removing portions of the conducting layer for additional circuit routing.

19. The method of claim 14 wherein the forming the first photoresist layer further includes selectively exposing a photoresist material to a light source by using a predetermined mask with a first and second regions, the first region passing less light than the second region for forming the two-portion structure.

20. The method of claim 19 wherein the first and second regions of the mask are made of different materials.

* * * * *